United States Patent
Flowers et al.

(10) Patent No.: US 6,246,148 B1
(45) Date of Patent: Jun. 12, 2001

(54) SURFACE ACOUSTIC WAVE FILTERS

(75) Inventors: James Edward Flowers, Dallas, TX (US); James Heighway, Layrac (FR)

(73) Assignees: Clarisay, Inc., Dallas, TX (US); Sawcom Limited, Hertfordshire (GB)

( * ) Notice: Subject to any disclaimer, the term of this patent is extended or adjusted under 35 U.S.C. 154(b) by 0 days.

(21) Appl. No.: 09/297,357

(22) PCT Filed: Oct. 31, 1997

(86) PCT No.: PCT/GB97/02993

§ 371 Date: May 14, 1999

§ 102(e) Date: May 14, 1999

(87) PCT Pub. No.: WO98/19394

PCT Pub. Date: May 7, 1998

(30) Foreign Application Priority Data

Oct. 31, 1996 (GB) .................................... 9622654

(51) Int. Cl.[7] ........................................ H03H 9/64
(52) U.S. Cl. ................ 310/313 B; 310/313 R; 333/193; 333/195
(58) Field of Search ................... 310/313 B, 313 R, 310/313 D, 364; 333/193, 195

(56) References Cited

U.S. PATENT DOCUMENTS

| | | | |
|---|---|---|---|
| 5,506,552 | * | 4/1996 | Seki et al. .............................. 333/195 |
| 5,663,697 | * | 9/1997 | Kobayashi et al. .................... 333/195 |
| 5,729,186 | * | 3/1998 | Seki et al. ............................. 333/194 |
| 5,773,917 | * | 6/1998 | Satoh et al. ........................... 310/364 |
| 5,818,146 | * | 10/1998 | Kurahashi et al. ............... 310/313 B |
| 5,844,347 | * | 12/1998 | Takayama et al. ................... 310/364 |
| 5,844,453 | * | 12/1998 | Matsui et al. ........................ 333/193 |
| 5,877,662 | * | 3/1999 | Kobayashi et al. .................... 333/195 |
| 5,909,156 | * | 6/1999 | Nishihara et al. .................... 333/193 |
| 5,914,646 | * | 6/1999 | Hashimoto ............................. 333/195 |
| 5,952,899 | * | 9/1999 | Kadota et al. ......................... 333/193 |
| 5,955,933 | * | 9/1999 | Nishihara et al. .................... 333/193 |
| 5,999,069 | * | 12/1999 | Ushiroku ............................... 333/193 |

FOREIGN PATENT DOCUMENTS

| | | | |
|---|---|---|---|
| 21 32 985 | * | 4/1980 | (DE) ...................................... 333/193 |
| 53-139450 | * | 5/1978 | (JP) ................................... 310/313 B |
| 4-288718 | * | 10/1992 | (JP) ................................... 310/313 B |

* cited by examiner

Primary Examiner—Thomas M. Dougherty
(74) Attorney, Agent, or Firm—Breiner & Breiner

(57) ABSTRACT

Filter structures are described consisting of a plurality of individual surface acoustic wave (SAW) resonators formed of inter-digitated metallic combs on a common piezoelectric substrate. Areas of metallisation (1, 2, 3, 4) between the combs provide means to connect the filter in a circuit, e.g. in a mobile telephone unit to act as a filter with a passband in the 800 to 2200 MHz range. The individual SAW resonators differ from one another and are interconnected in ladder and/or balanced bridge arrangements.

8 Claims, 6 Drawing Sheets

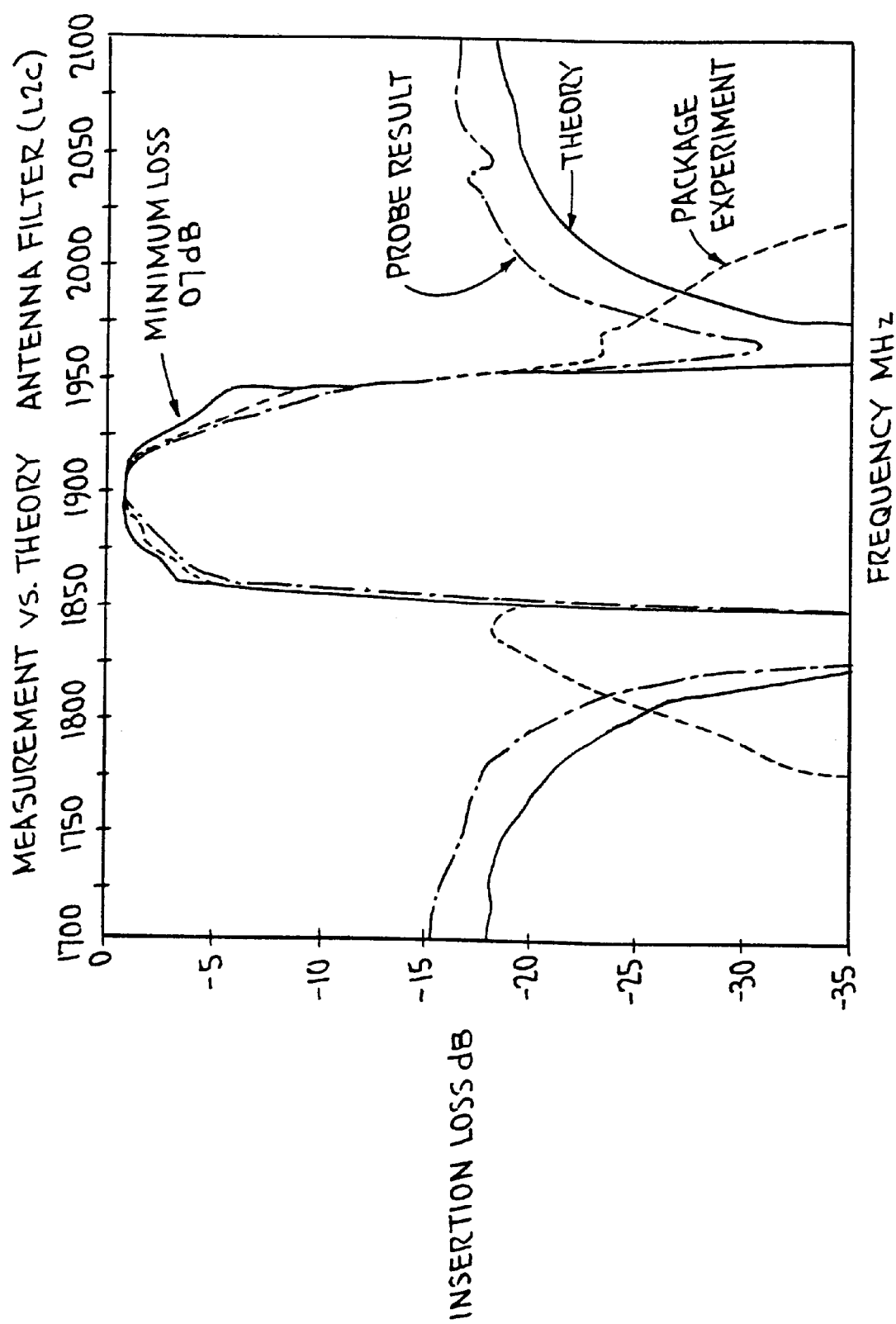

INTEGRATED IMAGE REJECTION FILTER
EXPERIMENT vs. THEORY

SIMULATED PERFORMANCE OF INTEGRATED GSM DUPLEXER

SURFACE ACOUSTIC WAVE FILTERS

This invention relates to filters and particularly to surface acoustic wave (SAW) filters for use in wireless communication applications, e.g. cellular telephone applications.

Substantial research effort has been devoted in recent years to the production of improved SAW filters for use in such wireless and telephone applications. For specific background in this area, reference may be had to papers given at the IEEE Ultrasonics Symposia in 1993 and 1994, in particular "Design Methodology and Synthesis Techniques for Ladder-Type SAW Resonator Coupled Filters", Hikita et al, given at the 1993 Ultrasonic Symposium and "New Design Procedures and Experimental Results of SAW Filters for Duplexers Considering Wide Temperature Range", Shibagaki et al, in the 1994 Ultrasonics Symposium of IEEE. Both of these papers (and, indeed, papers referred to in them) describe the general approach. Further developments are described in "Balanced Bridge SAW Impedance Element Filters" by J Heighway et al in a paper given at the 1994 IEEE Ultrasonics Symposium.

As indicated in the papers referred to above, such SAW filters may be made by depositing one or more metallic layers on a suitable piezoelectric substrate, such as quartz, lithium tantalate or lithium niobate or other appropriate material, and etching, or otherwise selectively removing the metallic layer, to leave inter-engaged comb-like structures which are described as SAW resonators and which can be used effectively in resonator-coupled filters for the purposes noted above.

We have now found that improved structures may be obtained which retain the major advantages of using SAW resonator filter constructions outlined in the papers referred to above, but which have substantial further advantages by forming a plurality of resonators on adjacent regions of a chip substrate and connecting them together in ladder and/or balanced bridge filter arrangements of known type via the metallisation on the substrate.

Thus, according to a first feature of the present invention, there is provided a multiple single port leaky SAW resonator filter structure consisting of piezoelectric substrate having deposited thereon a plurality of SAW resonators, each formed of an inter-engaged comb-like pattern of metallic coating on the substrate, the individual resonators being inter-connected via the metallic layer on the substrate to form a ladder and/or balanced bridge filter, or combinations of the same.

We have found that by using a plurality of such SAW resonators on a single substrate, filters may be designed having substantially improved insertion loss and power handling. By using a single port unit as an impedance element, a majority of the power in the filter passband is transmitted through the static capacitance of the device, so reducing the acoustic power circulating in the SAW resonators. The use of multiple resonators additionally divides the power between them, enhancing the power handling capacity of the filter unit.

Preferably the arrangement is such that the resonance and/or anti-resonance of the individual SAW resonators are either side of the desired centre frequency on which the filter is designed so that the one port leaky SAW resonators are not truly at resonance with the desired centre frequency, and this reduces the power circulating internally in the device.

By adopting the multiple resonator configurations according to the present invention, substantial power handling can be achieved without undue stress to the usually photo-lithographically produced conductive pattern. In addition, the devices according to the present invention have very low insertion losses.

Further enhancements may be made by adding further parallel or associated resonant structures to a filter structure according to the invention, with the object of introducing secondary desirable performance features, such as selective traps, secondary passbands, low group delay distortion and enhanced manufacturability.

The resonators may be provided by depositing a metallic coating on the substrate using standard known techniques. It is often preferable to form quite thick layers, e.g. 2000 to 10000 Å, and these are conveniently produced by depositing a first layer in a first deposition step and one or more subsequent layers in subsequent deposition steps, the second and any subsequent layers being in register with the first layer. In some cases, it may be desirable to deposit a sequence of layers of differing metallic composition, e.g. Al/Cu, followed by Cu followed by Al/Cu.

Following deposition, such resonator structures are highly susceptible to environmental influences, for example water vapour, ant it is accordingly much preferred, following the formation of the resonators, to passivate the structure. A convenient approach is to deposit over the entire filter unit structure, i.e. all of the resonators, a thin layer typically 50 nm thick of silicon dioxide, silicon nitride or other appropriate material. In addition to preventing adverse influences from the environment, the risk of electrical discharge from the unit when in use, particularly at high power loadings, is materially reduced.

Filter unit structures in accordance with the invention may be connected to other circuit elements by any convenient known techniques. Among these, a method of particular value is to use so-called "flip-chip" techniques. In these, a plurality of conductive balls, e.g. of gold, are deposited on areas of the deposited metal layer(s) which act as terminals and/or a surrounding "ground plane", and the entire unit is then flipped over and placed where necessary on to an appropriate circuit board or circuit substrate and the assembly then subjected to e.g. ultrasonic agitation to cause the balls to make mechanical and electrical contact with the electrically conductive portions of the circuit board or circuit substrate and to retain the filter unit in place. Such retention may, e.g. be enhanced by covering the entire assembly with an appropriate varnish or resin blob. This method of connecting the filter in a circuit is particularly preferred since it enables impedance matching to be optimised and passband losses to be reduced.

The filter structure may incorporate one or more resonators in parallel with ladder or balanced bridge filter configurations which are tuned to act as traps either side of the centre frequency of the filter.

As is known, the detailed electrical performance of the SAW resonator depends critically on the exact geometry and dimensions of the inter-engaged comb-like structures, and since this cannot be varied following manufacture, care needs to be taken in design and manufacture to ensure the desired performance and reproducibility.

It is a feature of the present invention that the individual resonators on the common substrate are not identical. In practice, each resonator needs to be optimised in an iterative design process to achieve the desired low loss high rejection performance of the overall filter unit. The constructional approach with a two-dimensional substrate and individual or multiple structure (each individually optimised and separately designed), joined together via metallic layers, enables very high performance to be obtained without major manufacturing difficulties.

The invention is illustrated by way of example with reference to the accompanying drawings in which:

FIGS. 4 to 6 show performance curves for filter units in accordance with the invention;

Figure 1:
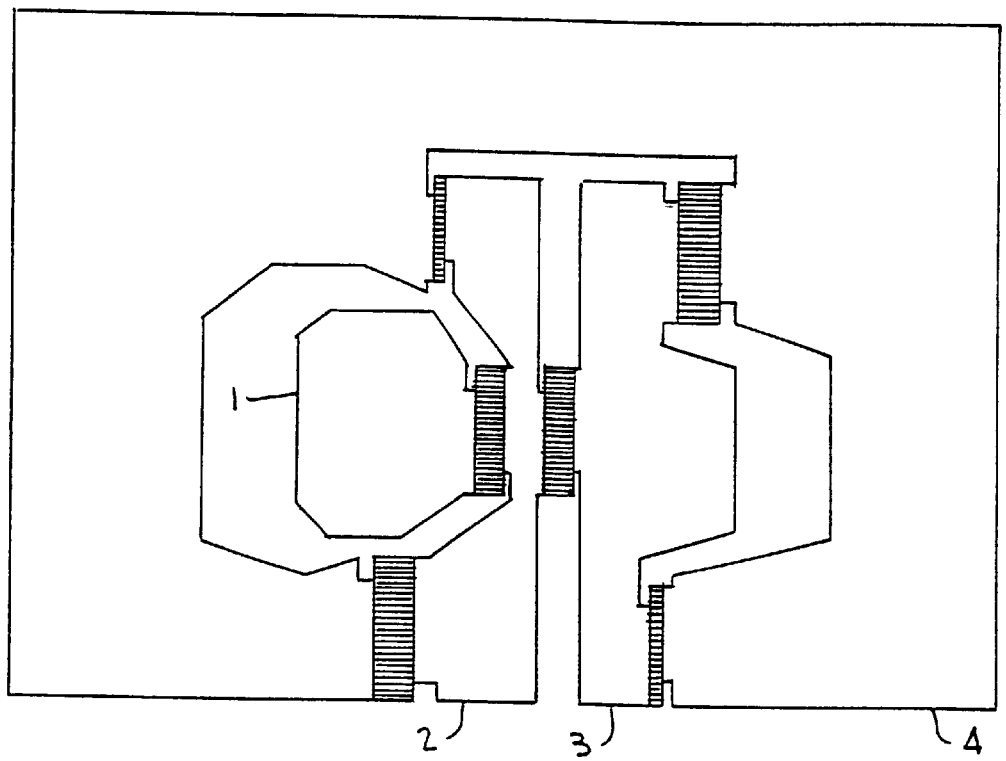
FIG. 1 shows on a highly magnified scale the general arrangement of a six-element filter unit in accordance with the present invention.

Referring first to FIG. 1, this is a diagrammatic representation of a pattern of deposited aluminium on a lithium niobate, lithium tantalate, quartz or other piezoelectric substrate (not illustrated). Looking like vertical bar codes on the figure are six SAW resonators. These are arranged between four areas of aluminium numbered 1 to 4 on the drawing. Each resonator consists of inter-engaged metallic combs projecting from two of the areas.

The structure in FIG. 1 is a structure having two filter stages and two traps. The first filter stage is constituted by the resonators between areas 1 and 2 and 4 and 2 and the second filter stage by the resonators between areas 2 and 3 and 3 and 4. A trap is constituted by a different configuration resonator between areas 4 and 2 towards the top left of the drawing as shown in FIG. 1 and a separate trap by a further resonator between areas 3 and 4, towards the bottom right of the drawing. Area 1 and area 3 constitute the two input and output terminals of the filter unit.

Figure 2:
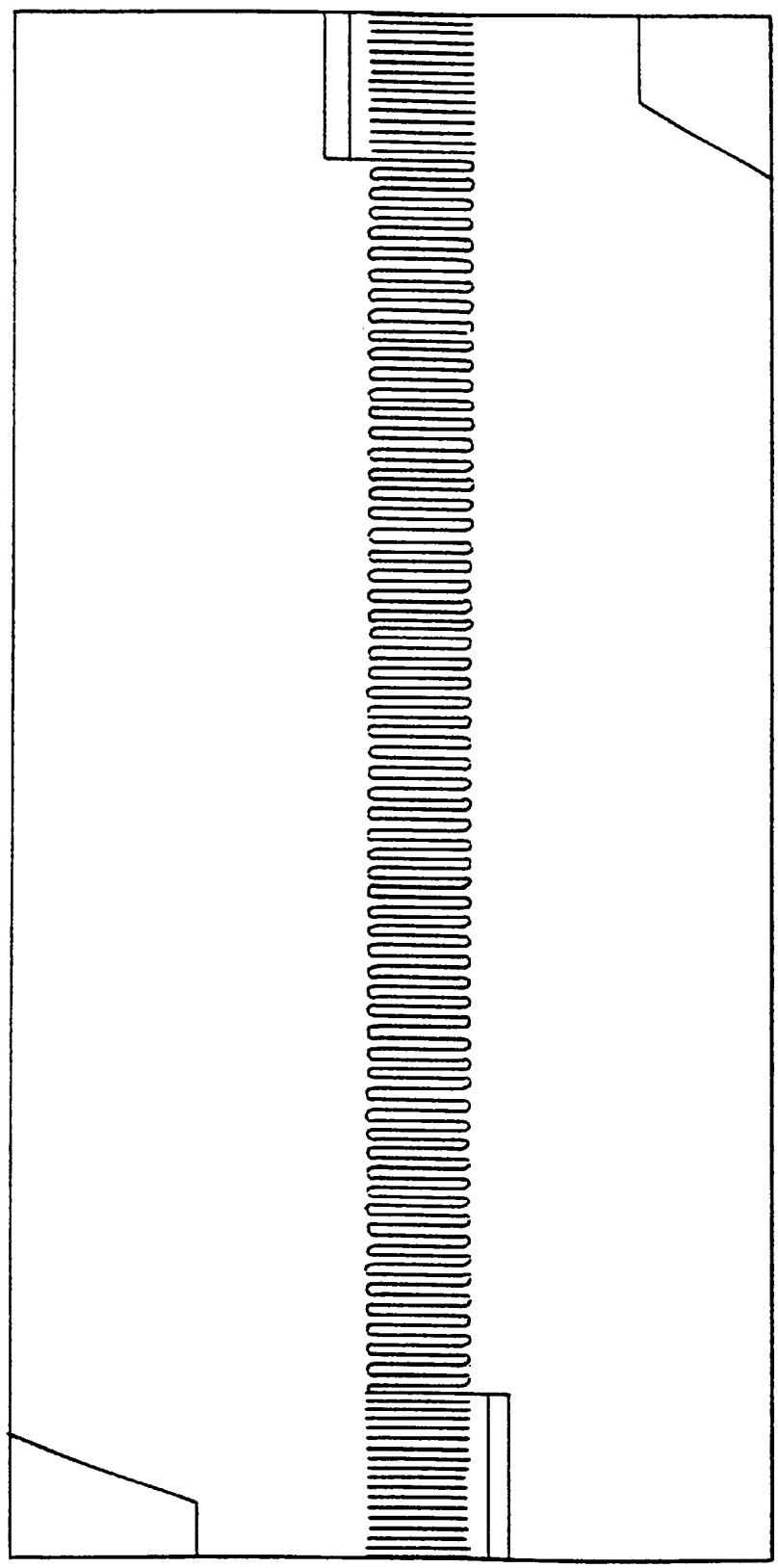
FIG. 2 shows at even greater magnification, a detail of one of the elements.

FIG. 2 is a highly enlarged illustration of a typical structure of a specific SAW resonator. In FIG. 2, which can be thought of as a photograph, the black areas correspond to the piezoelectric substrate and the grey areas to a deposited layer of conductor, aluminium in this case. As can be seen, in the central portion of the Figure, there are two intersecting sets of aluminium teeth or prongs with a sinuous uncoated portion of substrate visible between them. At each end of the set of inter-engaged prongs, one of the aluminium layers has a set of slots in it at substantially the same pitch as that of the sinuous line, which act as reflectors to define the limits of the resonating cavity, in known fashion.

Figure 3:
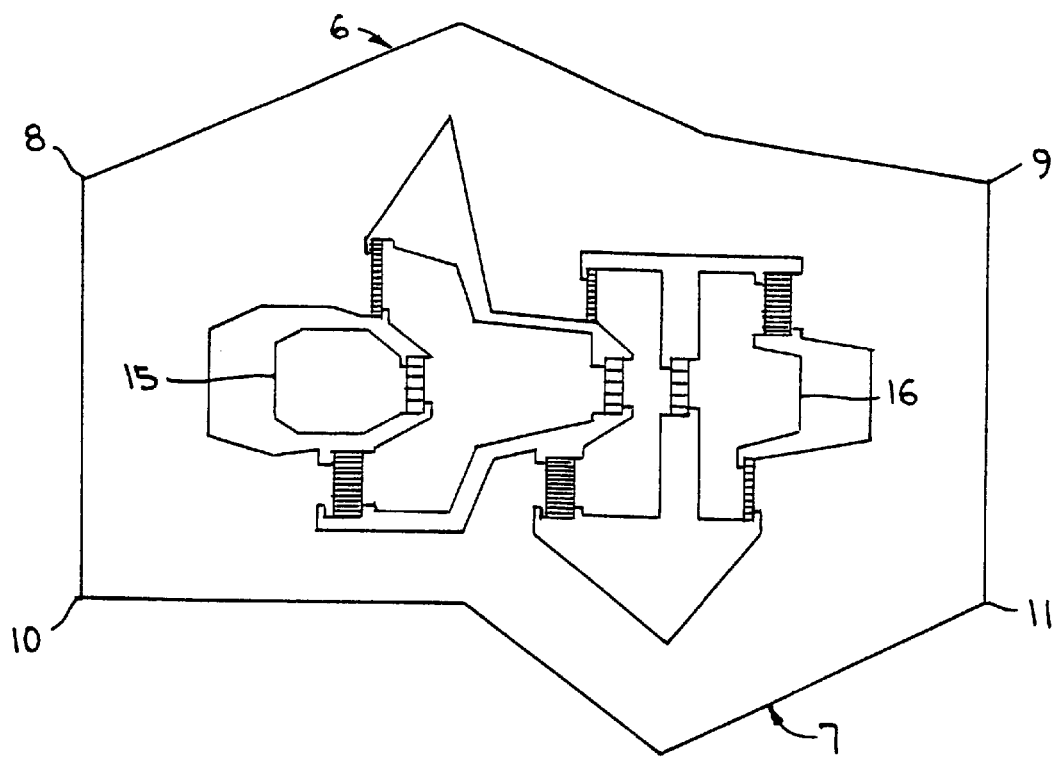
FIG. 3 shows a nine-element filter unit in accordance with the invention.

FIG. 3 shows a structure similar to the deposition patter in FIG. 1, but for a nine-resonator filter element. The deposition pattern shown has extra portions 6 and 7 as shown. After manufacture, these are removed to leave a generally rectangular area of deposited aluminium with the substrate again shown in white. Removal is above the line joining corners 8 and 9 as shown on FIG. 3 and below the line joining corners 10 and 11. Analogously to FIG. 1, the resonators in FIG. 3 are arranged in the form of three filter units, each consisting of a pair of resonators and three traps. The traps are the left hand and centre of the three resonators in the top row as seen in the Figure and the right hand resonator of the bottom row.

Areas identified as 15 and 16 serve as input and output terminals for the filter unit.

Figure 5:
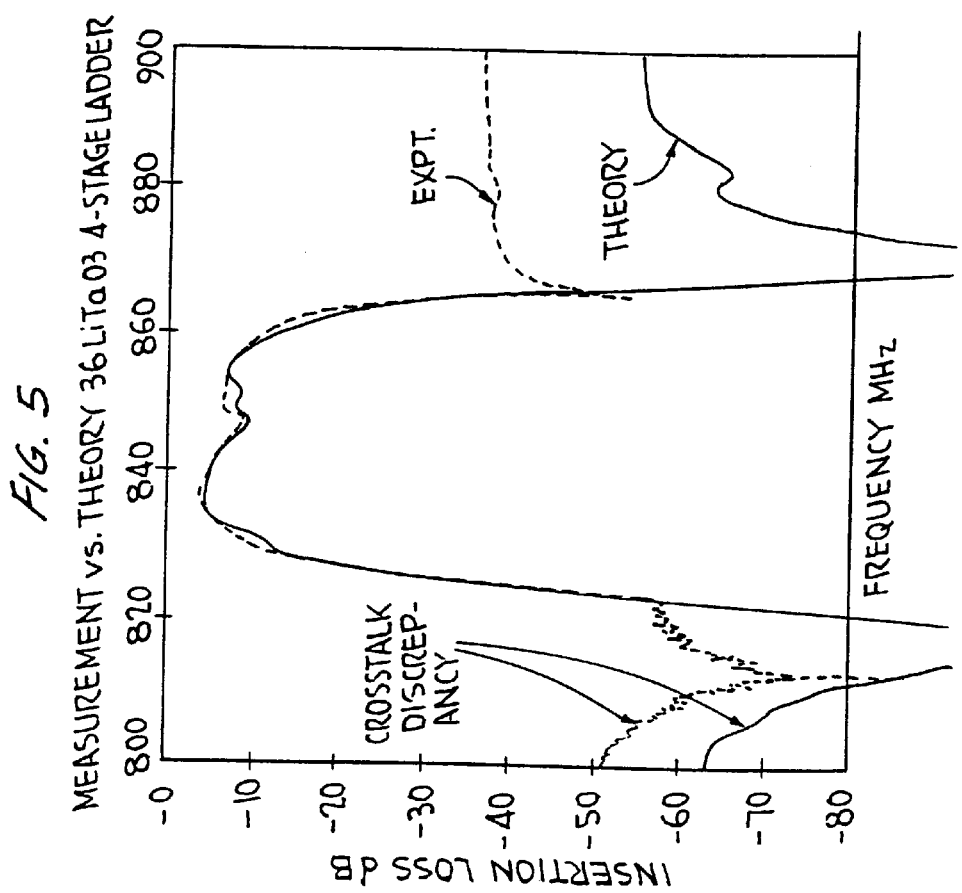
Figure 4:
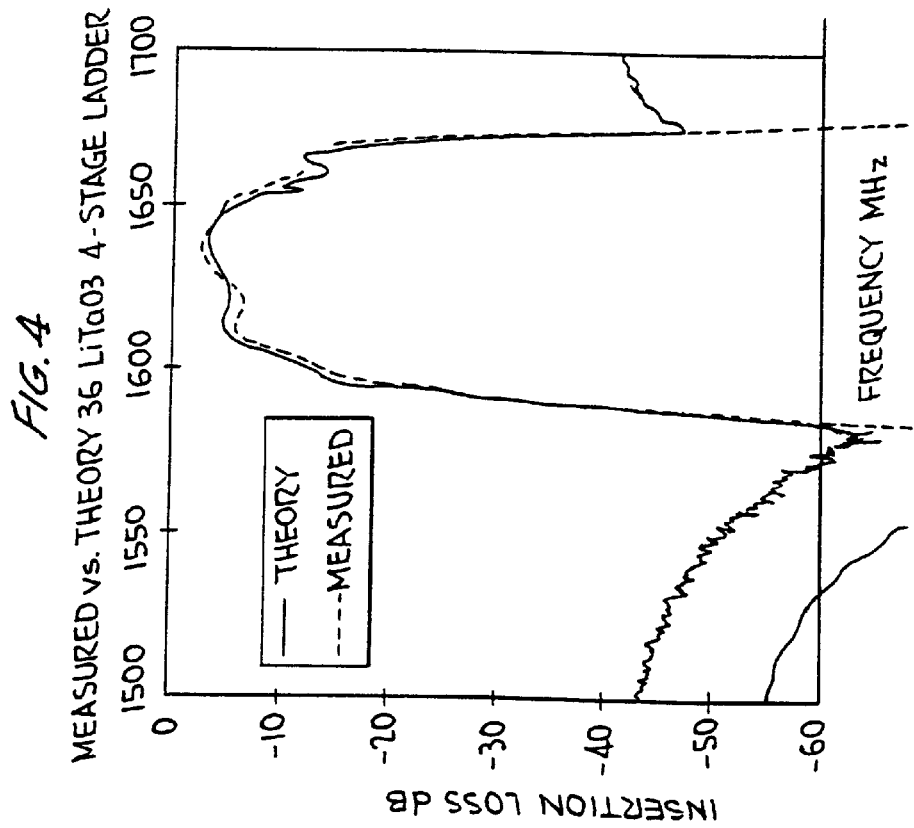

Using the approach to filter unit design in accordance with this invention, we have found that filters with passbands in the range 0 to 2.0 GHz can be constructed having low insertion losses, high power handling capacity, and good selective performance. FIGS. 4 to 6 show typical experimental results for such filters.

Figure 7:
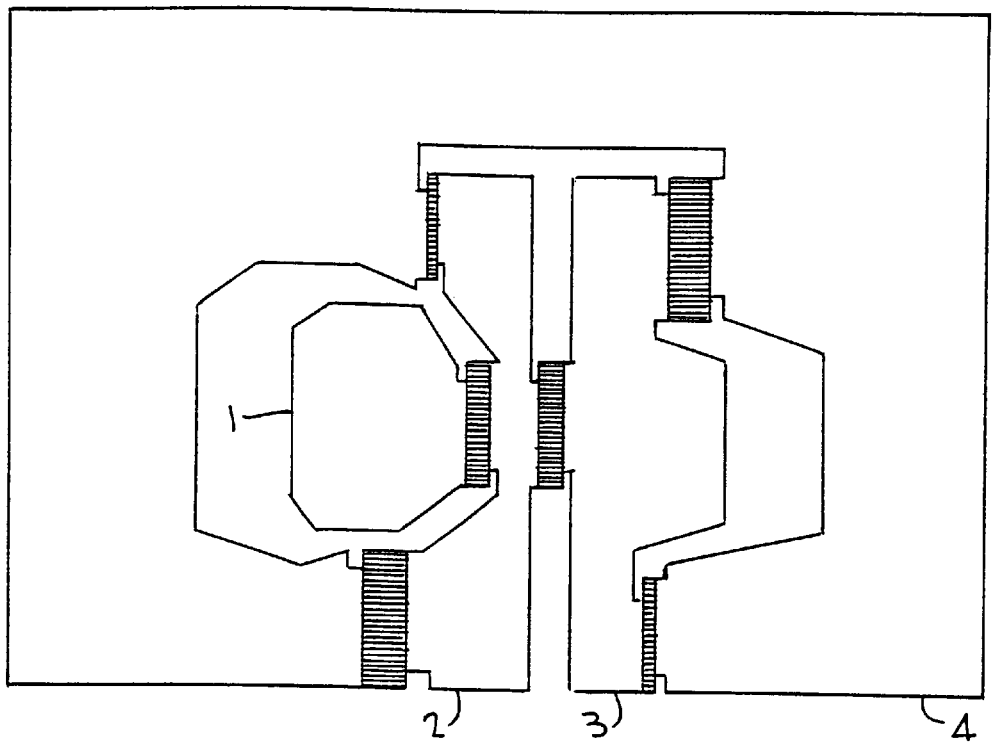
FIG. 7 shows a further filter structure, diagrammatically.
Figure 8:
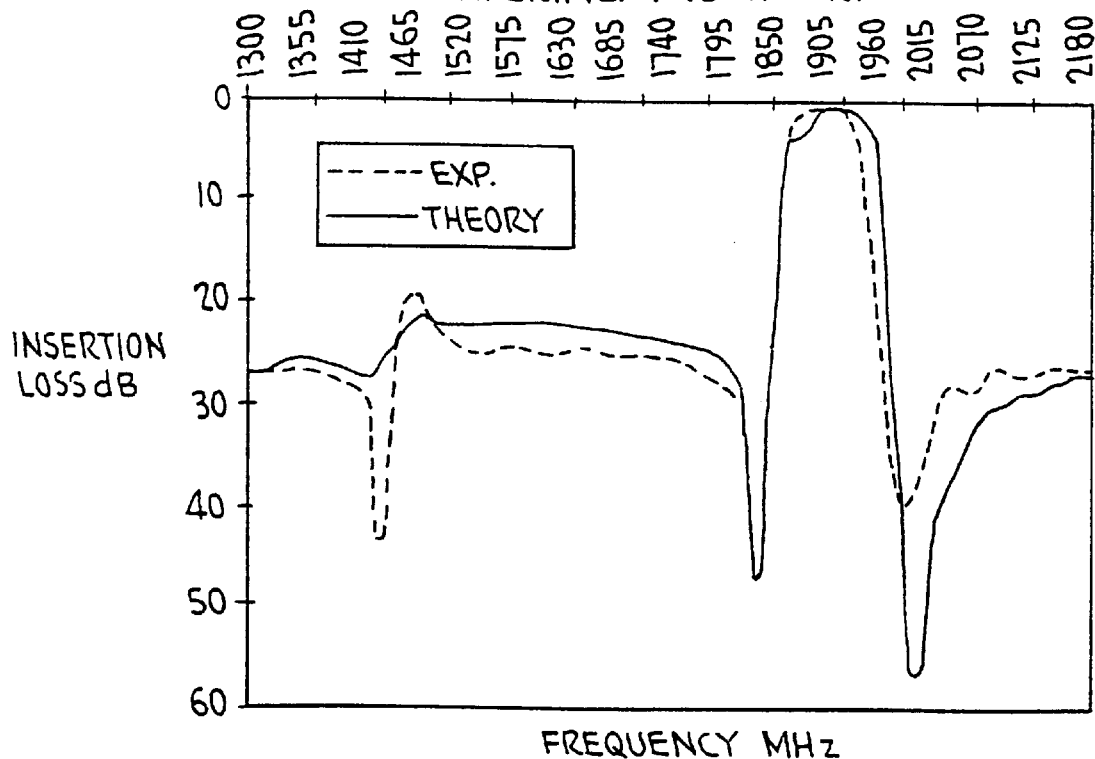
FIG. 8 shows a performance curve for the filter of FIG. 7.

FIG. 7 shows a further filter structure similar to that shown in FIG. 1, in which the trap frequencies have been greatly separated from the passband of the filter for use as image rejection. The top left hand trap is designed to be frequency separated from the passband so as to act as image rejection. Its performance is shown in FIG. 8.

Figure 9:
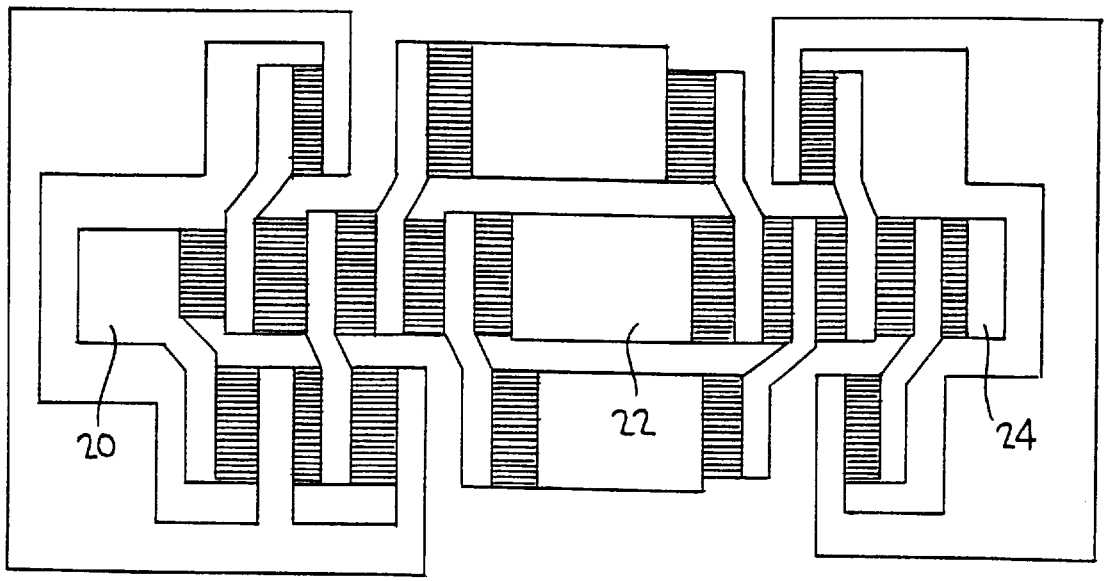
FIG. 9 shows a duplex filter structure, diagrammatically.
Figure 10:
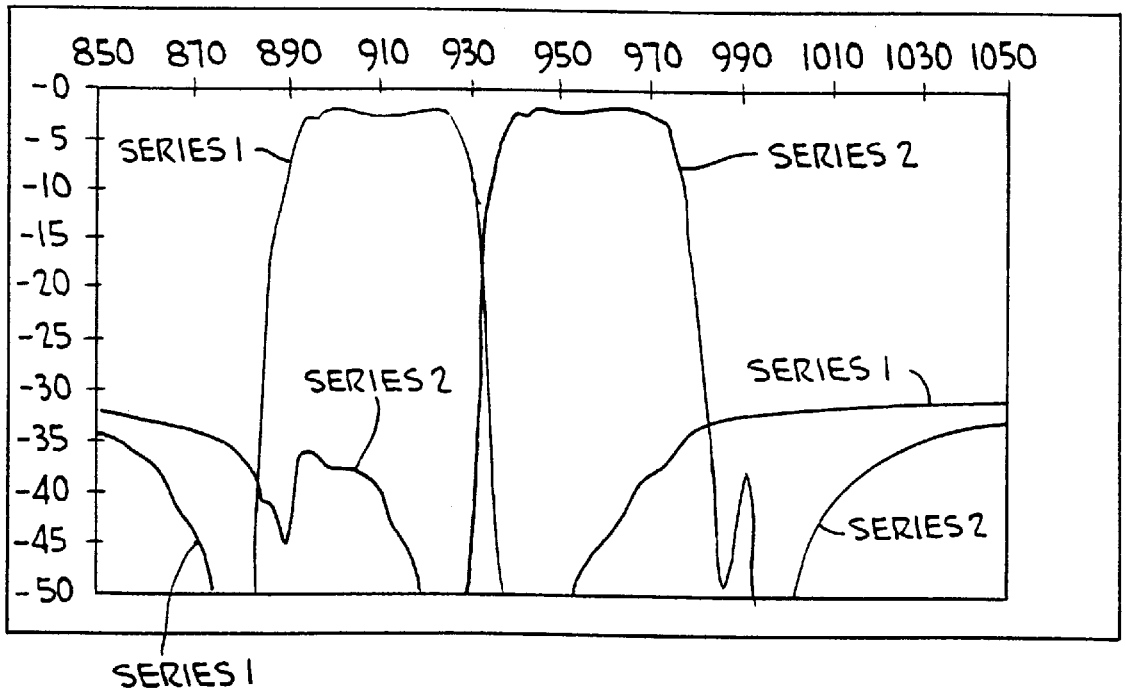
FIG. 10 shows a performance curve for the filter of FIG. 9.

FIG. 9 shows a duplex filter structure for use in an integrated gsm duplexer. This unit comprises a plurality of resonators used as passband filters and traps each of which has been individually optimised, the whole structure being used to form two distinct passbands and two distinct rejection bands whilst maintaining optimal overall passband loss. Its performance is shown in FIG. 10.

The filter of FIG. 9 is comprised of a first filter on the left hand side and a second filter on the right hand side. Areas 20 and 22 from the input and output terminals respectively of the first filter and areas 24 and 22 from the input and output terminals respectively of the second filter. In an alternative embodiment, area 22 is a common input terminal for the first and second filters and areas 20 and 24 are output terminals for the first and second filters respectively.

What is claimed is:

1. A multiple single port leaky SAW resonator filter comprising a piezoelectric substrate having deposited thereon a plurality of SAW resonators, each resonator being formed of an inter-engaged comb-like pattern of metallic coating on the substrate, and each individual resonator being not identical and being connected together, via the metallic coating on the substrate, to form a ladder or balanced bridge or combination ladder and balanced bridge filter structure.

2. A filter according to claim 1 wherein resonance and/or anti-resonance of each of the SAW resonators are set either side of a given centre frequency on which the filter is based so that one leaky port SAW resonators are not at resonance with the centre frequency.

3. A filter according to claim 1 or 2 wherein the resonators are deposited (photolithographically) and have a thickness in a direction perpendicular to a substrate of 2000 to 10000 Å.

4. A filter according to claim 3 wherein the resonators are built up from a plurality of sequentially deposited metallic layers.

5. A filter according to claim 4 wherein composition of the metallic layers varies through the thickness of the resonators.

6. A filter according to claim 1 further comprising a passivation layer which covers all of the SAW resonators on the substrate.

7. A filter according to claim 1 wherein performance characteristics of each of the SAW resonators differ from each other.

8. A filter according to claim 7 wherein the performance characteristics of each of the SAW resonators is used to produce specific rejection traps, secondary passbands, low group delay distortion and enhanced manufacturability.

* * * * *